(12) United States Patent
Liang et al.

(10) Patent No.: US 11,714,324 B2
(45) Date of Patent: Aug. 1, 2023

(54) DISPLAY PANELS

(71) Applicant: InnoLux Corporation, Miao-Li County (TW)

(72) Inventors: Hsing-Yi Liang, Miao-Li County (TW); Kuei-Ling Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/827,948

(22) Filed: May 30, 2022

(65) Prior Publication Data

US 2022/0291561 A1 Sep. 15, 2022

Related U.S. Application Data

(63) Continuation of application No. 17/329,652, filed on May 25, 2021, now Pat. No. 11,372,299, which is a (Continued)

(30) Foreign Application Priority Data

Jan. 8, 2015 (TW) .................................. 104100493

(51) Int. Cl.
  *G02F 1/1362* (2006.01)
  *G02F 1/1368* (2006.01)
  *H01L 27/12* (2006.01)

(52) U.S. Cl.
  CPC ...... *G02F 1/136286* (2013.01); *G02F 1/1368* (2013.01); *H01L 27/124* (2013.01); *H01L 27/1222* (2013.01)

(58) Field of Classification Search
  CPC .................................................. G02F 1/1362
  See application file for complete search history.

(56) References Cited

U.S. PATENT DOCUMENTS 9,541,808 B2  1/2017 Matsumura et al.
2010/0025692 A1* 2/2010 Hsiao ................ H01L 29/42384
                                                           257/E33.053

(Continued)

FOREIGN PATENT DOCUMENTS

JP      2013-076864 A    4/2013

OTHER PUBLICATIONS

Korean language office action dated Sep. 26, 2022, issued in application No. KR 10-2016-0000548.

*Primary Examiner* — Sang V Nguyen
(74) *Attorney, Agent, or Firm* — McClure, Qualey & Rodack, LLP

(57) ABSTRACT

A display panel includes a first substrate; a scan line and a data line disposed on the first substrate and extending in a first direction and a second direction, respectively, wherein the data line intersects the scan line; a polysilicon layer disposed on the first substrate. In a top view, the polysilicon layer includes: a first channel region overlapping a portion of the scan line; a second channel region overlapping another portion of the scan line; a non-channel region not overlapping the scan line and connected between the first channel region and the second channel region; a long region extended in the second direction; wherein a portion of the non-channel region extends in the first direction, the portion has a first width in the second direction, the long region has a second width in the first direction, and the first width is greater than the second width.

7 Claims, 6 Drawing Sheets

Related U.S. Application Data continuation of application No. 16/846,524, filed on Apr. 13, 2020, now Pat. No. 11,048,131, which is a continuation of application No. 15/868,294, filed on Jan. 11, 2018, now abandoned, which is a continuation of application No. 14/830,036, filed on Aug. 19, 2015, now Pat. No. 9,897,879.

(56) References Cited

U.S. PATENT DOCUMENTS

| | | | |
|---|---|---|---|
| 2016/0013213 A1* | 1/2016 | Ishizaki | H01L 29/0847 257/71 |
| 2016/0093647 A1* | 3/2016 | Kim | H01L 27/1255 257/40 |

* cited by examiner

DISPLAY PANELS

CROSS REFERENCE TO RELATED APPLICATIONS

This application is a Continuation of pending U.S. patent application Ser. No. 17/329,652, filed on May 25, 2021, now U.S. Pat. No. 11,372,299, which is a Continuation of pending U.S. patent application Ser. No. 16/846,524, filed on Apr. 13, 2020, now U.S. Pat. No. 11,048,131, which is a Continuation of U.S. patent application Ser. No. 15/868,294, filed on Jan. 11, 2018, now abandoned, which is a Continuation of U.S. patent application Ser. No. 14/830,036, filed Aug. 19, 2015, now U.S. Pat. No. 9,897,879, which claims priority of Taiwan Patent Application No. 104100493, filed on Jan. 8, 2015, the entirety of which is incorporated by reference herein.

BACKGROUND

Field of the Invention

The present invention relates to display panel technology, and in particular to the active layer pattern design of the display panels which have an active layer of a thin-film transistor (TFT).

Description of the Related Art

In recent years, liquid-crystal displays (LCDs) have become the most commonly used plane displays and have been extensively applied in various kinds of electronic devices due to their advantages, which include being thin, being lightweight, having low power consumption, having low radiation, etc. In an active-matrix LCD, the TFT acts as a driving device for the control of pixel switching. Based on the materials of an active layer of the TFTs, there are many kinds of TFTs such as an amorphous silicon TFT, or a polycrystalline silicon TFT.

However, with regard to TFTs of LCDs, there are still many improvements that are required in the formation of the active layer of TFTs to allow the LCDs to achieve a better display quality.

BRIEF SUMMARY

According to some embodiments of the disclosure, display panels are provided to improve an active layer of TFTs. By using the pattern width design of the active layer, the entire resistance of the active layer is reduced. The electrical properties of TFTs are thereby improved, and the image display quality of the display panels is also enhanced.

In some embodiments of the disclosure, a display panel is provided. The display panel includes a first substrate, and scan lines intersecting with data lines and disposed on the first substrate. An active layer is disposed on the first substrate and between the data lines and the first substrate. A transparent conductive layer is disposed on the first substrate and above the active layer. The active layer includes a first contact region electrically connected to the data lines, a second contact region electrically connected to the first transparent conductive layer and an intermediate region between the first and second contact regions. The intermediate region includes a first channel region overlapping with the scan lines and a non-channel region not overlapping with the scan lines, and the non-channel region has a width that is greater than the width of the first channel region.

In some embodiments of the disclosure, a display panel is provided. The display panel includes a first substrate; a scan line and a data line intersecting with each other to form an intersecting region and disposed on the first substrate, wherein the scan line extends in a first direction; and an active layer disposed on the first substrate and between the data line and the first substrate. The active layer includes a first contact region electrically connected to the data line through a first via hole, a first channel region overlapping a portion of the scan line, a second channel region overlapping another portion of the scan line, and a non-channel region not overlapping the scan line and connected between the first channel region and the second channel region. At least a portion of an outline of the non-channel region has an arc shape.

In some embodiments of the disclosure, a display panel is provided. The display panel includes a first substrate. A scan line and a data line are disposed on the first substrate, wherein the scan line extends in a first direction, and the data line extends in a second direction and intersects the scan line. An active layer is disposed on the first substrate and between the data line and the first substrate. In a top view, the active layer includes a first channel region overlapping a portion of the scan line; a second channel region overlapping another portion of the scan line; a non-channel region not overlapping the scan line and connected between the first channel region and the second channel region; a long region extended in the second direction; a turning region disposed between the long region and the first channel region. A portion of the non-channel region extends in the first direction, the portion has a first width in the second direction, the long region has a second width in the first direction, and the first width is greater than the second width.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
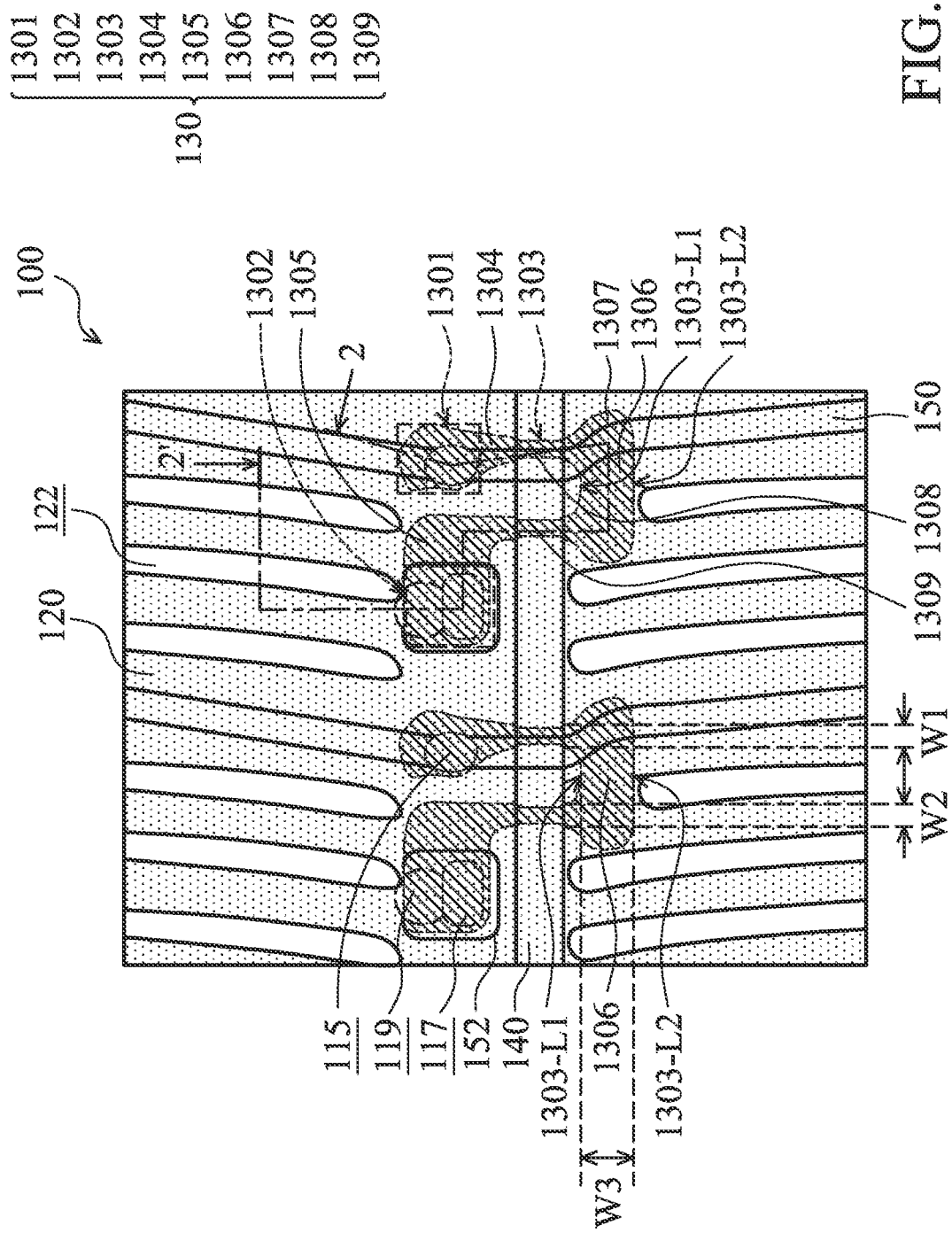
FIG. 1 shows a partial plane view of a display panel according to some embodiments of the disclosure.

FIG. 1 shows a partial plane view of a display panel 100 according to some embodiments of the disclosure. The display panel 100 includes a plurality of scan lines 140 intersecting with a plurality of data lines 150, and disposed on the first substrate (not shown in FIG. 1) to define a plurality of sub-pixel areas. In the embodiment, the sub-pixel areas are the areas enclosed by the two adjacent data lines and the two adjacent scan lines. TFTs are disposed near the intersecting position of the scan lines 140 and the data lines 150. The TFTs are switching devices for controlling the sub-pixel areas and are electrically connected to the data lines. According to an embodiments of the disclosure, the TFT includes an active layer 130 made of low-temperature polysilicon (LTPS). The active layer 130 includes a first contact region 1301, a second contact region 1302, and an intermediate region 1303 between the first and second contact regions, 1301 and 1302. The portion of the intermediate region 1303 of the active layer 130 overlapping the scan line 140 produces two channel regions, which are the first channel region 1308 and the second channel region 1309. The portion of the intermediate region 1303 of the active layer 130 not overlapping the scan line 140 is a non-channel region such as a first non-channel region 1304 on the upper side of the scan line 140 near the data line, a second non-channel region 1305 on the upper side of the scan line 140 far away from the data line, and a third non-channel region 1306 on the underside of the scan line 140 shown in FIG. 1.

In addition, as shown in FIG. 1, in some embodiments, the display panel 100 further includes a second transparent conductive layer 120 which is used as a top transparent conductive layer. In the embodiments, the second transparent conductive layer 120 is used as a common electrode, and the second transparent conductive layer 120 has a plurality of slits 122 formed therein. The second transparent conductive layer 120 covers the scan line 140, data line 150, and the active layer 130. In some embodiments, the second transparent conductive layer 120 covers a via hole 115 in the first contact region 1301 of the active layer 130 and via holes 117 and 119 in the second contact region 1302 of the active layer 130. In some other embodiments, the second transparent conductive layer 120 can have an opening (not shown in FIG. 1) near the locations of the via holes 117 and 119. The opening of the second transparent conductive layer 120 is near the second contact region 1302 to avoid the second transparent conductive layer 120 covering the via holes 117 and 119. In the embodiments, the data line 150 has a non-linear wiring type, and the data line 150 is essentially extended in a direction. In other embodiments, the data line 150 can have a linear wiring type. In the embodiments, the scan line 140 has a linear wiring type. In other embodiments, the scan line 140 can have a non-linear wiring type, and the scan line 140 has an essentially extension direction.

As shown in FIG. 1, the first channel region 1308 has a first width W1, the second channel region 1309 has a second width W2, and the first width W1 and the second width W2 are essentially extended in a direction parallel to the scan line 140. The portion of the intermediate region 1303 between the first channel region 1308 and the second channel region 1309 (namely, a third non-channel region 1306) has a third width W3. The third width W3 is a perpendicular distance between a first side 1303-L1 and a second side 1303-L2 of the intermediate region 1303. The first side 1303-L1 is the inner side of the intermediate region 1303 of the active layer 130. The second side 1303-L2 is the outer side of the intermediate region 1303 of the active layer 130.

According to the embodiments of the disclosure, the third width W3 of the third non-channel region 1306 is greater than the first width W1 of the first channel region 1308, and the third width W3 of the third non-channel region 1306 is also greater than the second width W2 of the second channel region 1309. In addition, according to the embodiments of the disclosure, the first non-channel region 1304 and the second non-channel region 1305 of the intermediate region 1303 not overlapping the scan line 140 have widths that are greater than the first width W1 of the first channel region 1308. The width of the first non-channel region 1304 and the second non-channel region 1305 are also greater than the second width W2 of the second channel region 1309. In the embodiment of the disclosure, the width of each portion of the intermediate region 1303 is defined as the perpendicular distance between the two sides 1303-L1 and 1303-L2 of the intermediate region 1303. Accordingly, the directions of the widths of some portions of the intermediate region 1303 may not be parallel to the extension direction of the scan line 140.

In order to satisfy the requirement that the TFT be used as a pixel switching device, the length-to-width ratio of the first channel region 1308 and the length-to-width ratio of the second channel region 1309 produced by the active layer 130 of the TFT overlapping the scan line 140 need to be maintained within a certain range. Accordingly, the first width W1 of the first channel region 1308 and the second width W2 of the second channel region 1309 need to satisfy the design requirements of the resolution of display panels to the channel's length-to-width ratio of the TFT. In a known manufacturing technology of display panels, except for the contact regions, the other parts of the active layer of the TFT have an identical width. The width of the active layer is usually formed to satisfy the requirements of the length-to-width ratio of the channel regions. However, the resistance of the active layer which is made this way cannot be reduced, and the performance of the TFTs cannot be enhanced.

According to the embodiments of the disclosure, the widths of the first non-channel region 1304, the second non-channel region 1305, and the third non-channel region 1306 of the active layer 130 are greater than the width of the first channel region 1308 and are also greater than the width of the second channel region 1309. Thus, the pattern of the active layer 130 has a width change wherein the non-channel region is wider and the channel region is narrower. Because the first non-channel region 1304, the second non-channel region 1305, and the third non-channel region 1306 have greater widths, the entire resistance of the active layer 130 made of LTPS is reduced. At the same time, the widths of the first channel region 1308 and the second channel region 1309 also satisfy the requirements of the length-to-width ratio for the channel regions of the TFTs. Accordingly, the embodiment of the disclosure can enhance the electrical performance of the TFTs.

In some embodiments, as shown in FIG. 1, the third non-channel region 1306 between the first channel region 1308 and the second channel region 1309 of the intermediate region 1303 has two protruding parts 1307. The two protruding parts 1307 protrude outward from the first channel region 1308 and the second channel region 1309 respectively in a direction that is parallel to the scan line 140. Moreover, in some embodiments, the width W1 of the first channel region 1308 may be approximately the same as the width W2 of the second channel region 1309. In some other embodiments, the width W1 of the first channel region 1308 is different from the width W2 of the second channel region 1309. Furthermore, as shown in FIG. 1, in some embodiments, the data line 150 can be a data line with curves. To be more specific, an outline of the data line 150 corresponding to the via hole 115 has an arc shape. The distance between the first contact region 1301 of the active layer 130 and the scan line 140 is not much different from the distance between the second contact region 1302 of the active layer 130 and the scan line 140. The active layer 130 with a short length of the intermediate region 1303 is then formed.

Figure 2:
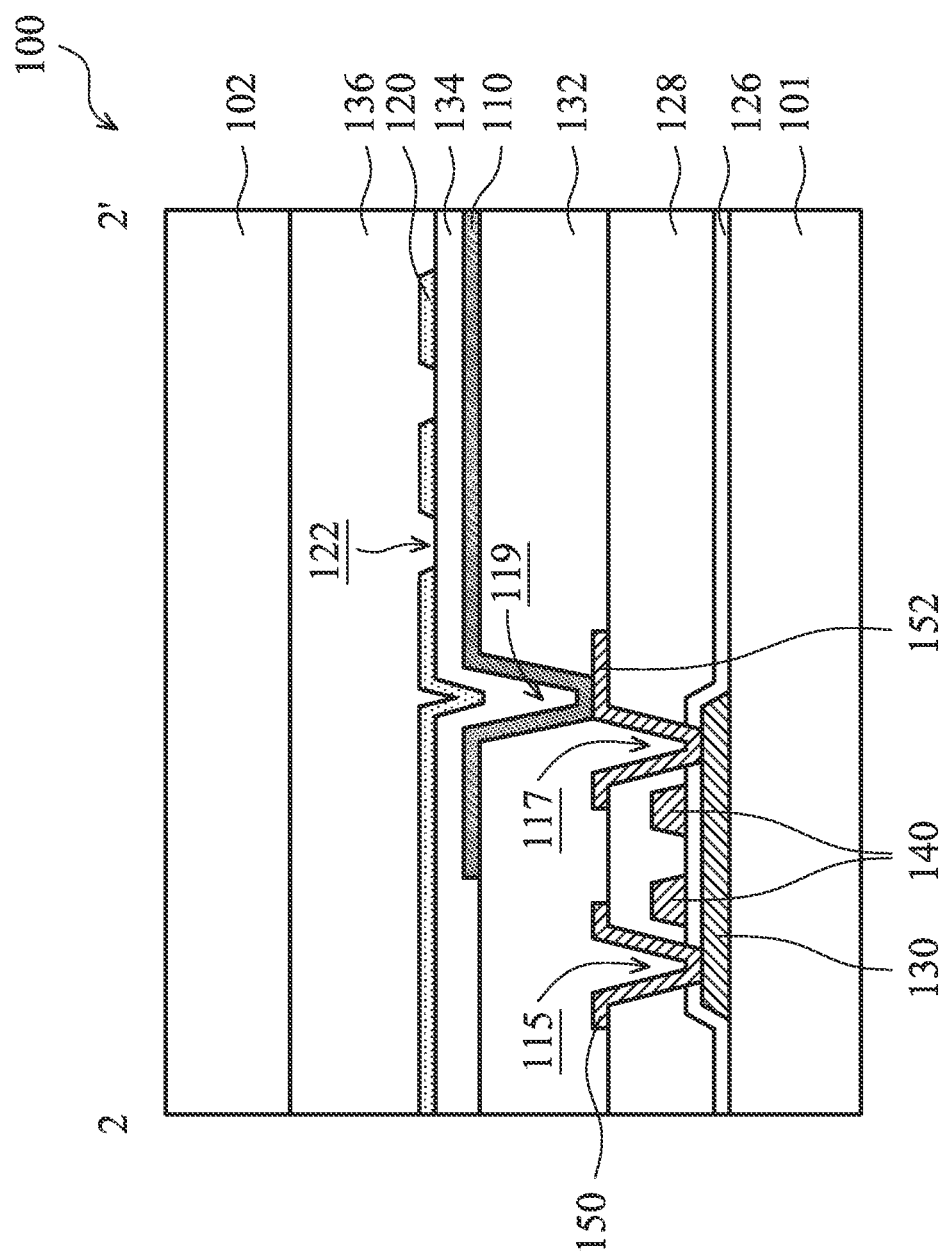
FIG. 2 shows a partial cross section of a display panel, along the line 2-2' shown in FIG. 1, according to some embodiments of the disclosure.

Referring to FIG. 2, a partial cross section of a display panel 100 along the line 2-2' shown in FIG. 1 according to some embodiments is shown. As shown in FIG. 2, the display panel 100 includes a first substrate 101. A scan line 140 and a data line 150 are disposed on the first substrate 101. An active layer 130 is disposed on the first substrate 101 and under the data line 150 and the scan line 140. The active layer 130 is disposed between the data line 150 and the first substrate 101. In some embodiments, the TFTs of the display panel 100 can have a top-gate structure, as shown in FIG. 2, and a channel region produced by the scan line (gate) 140 overlapping with the active layer 130 is located above the active layer 130. In some other embodiments, the TFTs of the display panel can have a bottom-gate structure, and a channel region produced by a scan line (gate) overlapping with an active layer is located under the active layer.

Referring to FIGS. 1 and 2, a via hole 115 is formed over the first contact region 1301 of the active layer 130. The first contact region 1301 of the active layer 130 is electrically connected to the data line 150 through the via hole 115. In addition, as shown in FIG. 2, the display panel 100 further includes a first transparent conductive layer 110. Via holes 117 and 119 are formed over the second contact region 1302 of the active layer 130. The second contact region 1302 of the active layer 130 is electrically connected to the first transparent conductive layer 110 through the via holes 117 and 119. The via hole 115 is formed by forming a hole in a first insulating layer 126 and a second insulating layer 128 above the first contact region 1301 of the active layer 130, and the metal materials forming the data line 150 fill in the hole of the via hole 115. As a result, the data line 150 is electrically connected to the first contact region 1301 of the active layer 130 through the via hole 115. In addition, a portion of the data line 150 forms a source electrode of the TFT. Moreover, the via hole 117 is formed by forming a hole in the first insulating layer 126 and the second insulating layer 128 above the second contact region 1302 of the active layer 130, and the metal materials forming a drain electrode 152 of the TFT are electrically connected to the active layer 130 through the via hole 117. Furthermore, the via hole 119 is formed by forming a hole in a third insulating layer 132 over the second insulating layer 128, and the materials forming the first transparent conductive layer 110 fill in the hole of the via hole 119. As a result, the first transparent conductive layer 110 is electrically connected to the drain electrode 152 of the TFT through the via hole 119, and is electrically connected to the second contact region 1302 of the active layer 130 through the via hole 117. The first insulating layer 126 and the second insulating layer 128 can be made of the same or different inorganic materials, such as SiOx or SiNx.

As shown in FIG. 2, the first insulating layer 126 is disposed between dual gates formed of the scan line 140 and the active layer 130. The second insulating layer 128 and the third insulating layer 132 are formed over the scan line 140. The via hole holes 115 and 117 are formed in the first insulating layer 126 and the second insulating layer 128. The via hole 119 is formed in the third insulating layer 132. In some embodiments, a portion of the transparent conductive layer 110 is conformally formed in the via hole 119 of the third insulating layer 132. The metal materials forming the source electrode of the TFT can be conformally formed in the via hole 115. The metal materials forming the drain electrode 152 of the TFT can also be conformally formed in the via hole 117. The third insulating layer 132 can be organic materials used for planarization, such as an organic material like poly fluoroalkoxy (PFA) or a color filter material.

The display panel 100 further includes a second substrate 102, and a display medium layer 136 is disposed between the second substrate 102 and the first substrate 101. In some embodiments, the display medium layer 136 can be a liquid crystal layer, the second substrate 102 is a color filter (CF) substrate, and the first substrate 101 is a TFT array substrate. In some other embodiments, a CF layer can be disposed on the first substrate 101. For example, the third insulating layer 132 can be replaced by a CF material.

In some embodiments, as shown in FIGS. 1 and 2, the display panel 100 further includes a second transparent conductive layer 120 disposed above the first transparent conductive layer 110. A fourth insulating layer 134 is disposed between the first transparent conductive layer 110 and the second transparent conductive layer 120. The first transparent conductive layer 110 is electrically insulated from the second transparent conductive layer 120 by the fourth insulating layer 134. The fourth insulating layer 134 can be made of inorganic materials, such as silicon oxide (SiOx) or silicon nitride (SiNx). In some embodiments, the second transparent conductive layer 120 is a patterned electrode including a plurality of slits 122. The display panel 100 can be a fringe field switching (FFS) wide-angle LCD panel due to the disposition of the slits 122 of the second transparent conductive layer 120 and the first transparent conductive layer 110. In the embodiments, the slits 122 do not exceed the range of the sub-pixel area. In other embodiments, the slits 122 can exceed the range of the sub-pixel area, for example, the slits 122 can exceed the data line 150 or they can exceed the scan line 140.

Figure 3:
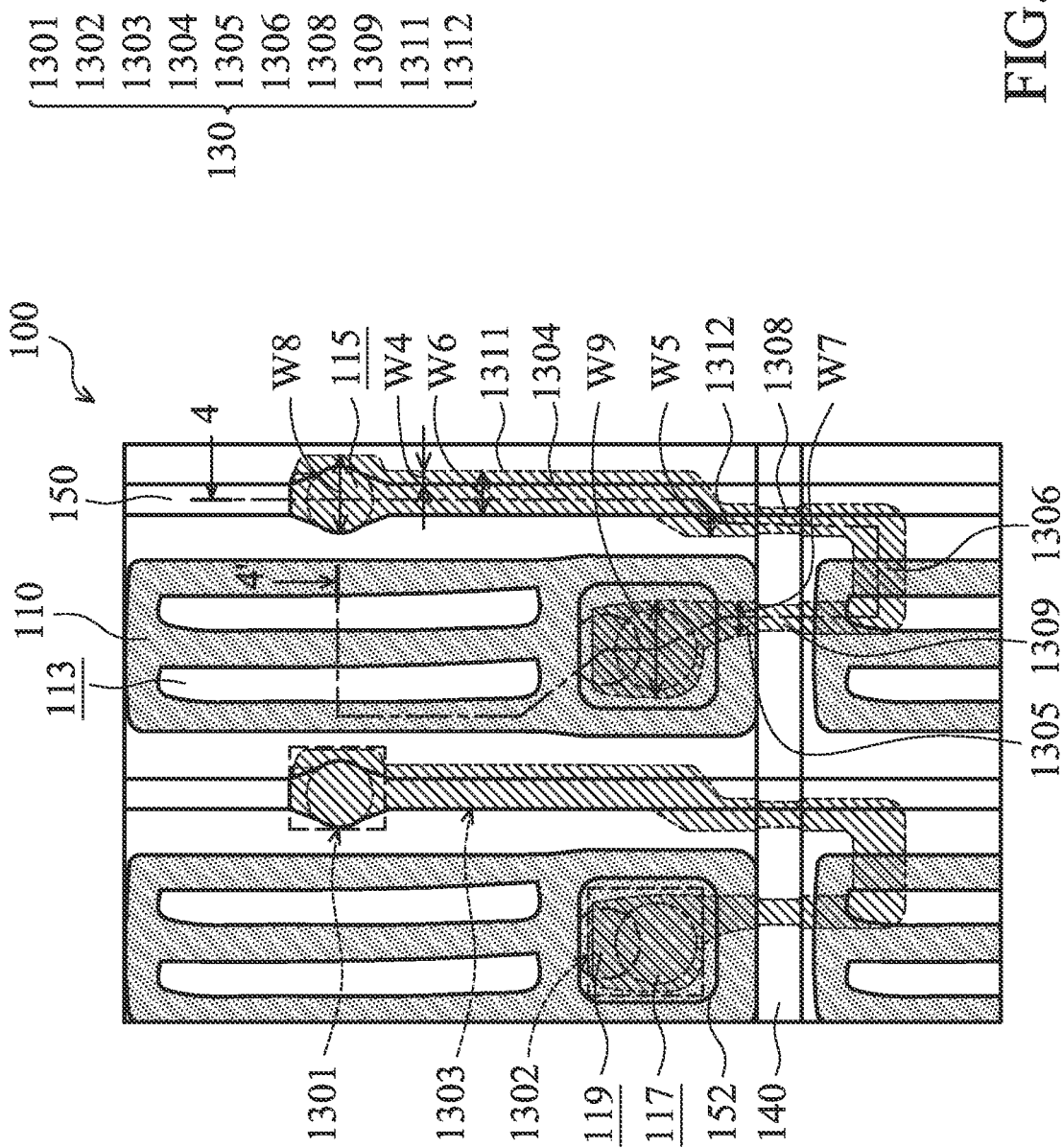
FIG. 3 shows a partial plane view of a display panel according to some embodiments of the disclosure.

FIG. 3 shows a partial plane view of a display panel 100 according to some other embodiments. The intermediate region 1303 of the active layer 130 overlapping the scan line 140 produces two channel regions i.e., the first channel region 1308 and the second channel region 1309. The portions of the intermediate region 1303 of the active layer 130 not overlapping the scan line 140 are a first non-channel region 1304, a second non-channel region 1305, and a third non-channel region 1306. According to the embodiments of the disclosure, the widths of the first non-channel region 1304, the second non-channel region 1305, and the third non-channel region 1306 are greater than widths of the first channel region 1308 and the second channel region 1309. Thus, the pattern of the active layer 130 has a width change wherein the non-channel region is wider and the channel region is narrower. The resistance of the active layer is thereby reduced.

As shown in FIG. 3, in some embodiments, the first contact region 1301 of the active layer 130 is farther away from the scan line 140 than the second contact region 1302 of the active layer 130. As a result, the first non-channel region 1304 between the first contact region 1301 and the scan line 140 has a longer length. Since the first non-channel region 1304 is longer than the third non-channel region 1306, the first contact region 1301 and the second contact region 1302 are staggered. Because the contact region needs a larger area to allow for an alignment error in the process, the two contact regions which are staggered can make these two contact regions be closer to each other in a direction that is substantially parallel to the scan line 140. Therefore, the width of single sub-pixel in the direction that is substantially parallel to the scan line 140 can be reduced. However, because the first non-channel region 1304 is long if the width of the first non-channel region 1304 is fixed, it would reduce the amount of sub-pixels and the design requirements pertaining to the resolution of the display panels is thereby limited. Accordingly, the first non-channel region 1304 has different widths (but they are wider than that of the channel region) to maintain the resistance thereof and reduce the effect on the aperture ratio of the display panels.

In some embodiments, as shown in FIG. 3, the data line 150 can be a straight data line, and the intermediate region 1303 of the active layer 130 partially overlaps the data line 150. As a result, the portions of the intermediate region 1303 which are not overlapped with the data line 150 include a first area 1311 and a second area 1312 disposed at two sides of the data line 150, respectively. The second area 1312 is disposed between the data line 150 and the second contact region 1302, and the first area 1311 is disposed on another side of the data line 150 that is opposite to the second area 1312. The first area 1311 has a width W4, and the second area 1312 has a width W5. The directions of the widths W4 and W5 are parallel to the essentially extension direction of the scan line 140. In some embodiments, the width W4 of the first area 1311 is approximately equal to the width W5 of the second area 1312. In some other embodiments, the width W4 of the first area 1311 can be greater than the width W5 of the second area 1312. In some other embodiments, the width W4 of the first area 1311 can be smaller than the width W5 of the second area 1312.

Compared to examples in which the active layer and the data line are totally overlapped, in some embodiments of the disclosure, the intermediate region 1303 of the active layer 130 partially overlaps the data line 150. As a result, the parasitic capacitance produced between the active layer 130 and the data line 150 is reduced. In addition, compared to example wherein the active layer and the data line do not overlap at all, in some embodiments of the disclosure, the intermediate region 1303 of the active layer 130 partially overlaps the data line 150. As a result, the aperture ratio of the display panels is increased.

In addition, in some embodiments, as shown in FIG. 3, the first non-channel region 1304 of the intermediate region 1303 of the active layer 130 has a width W6 near the first contact region 1301. The second non-channel region 1305 of the intermediate region 1303 has a width W7 near the second contact region 1302. The width W6 is greater than the width W7. Moreover, in some embodiments, the first contact region 1301 has a width W8, and the second contact region 1302 has a width W9. The width W9 is greater than the width W8. In some embodiments, the directions of the aforementioned widths W4~W9 are approximately parallel to the essentially extension direction of the scan line 140.

Figure 4:
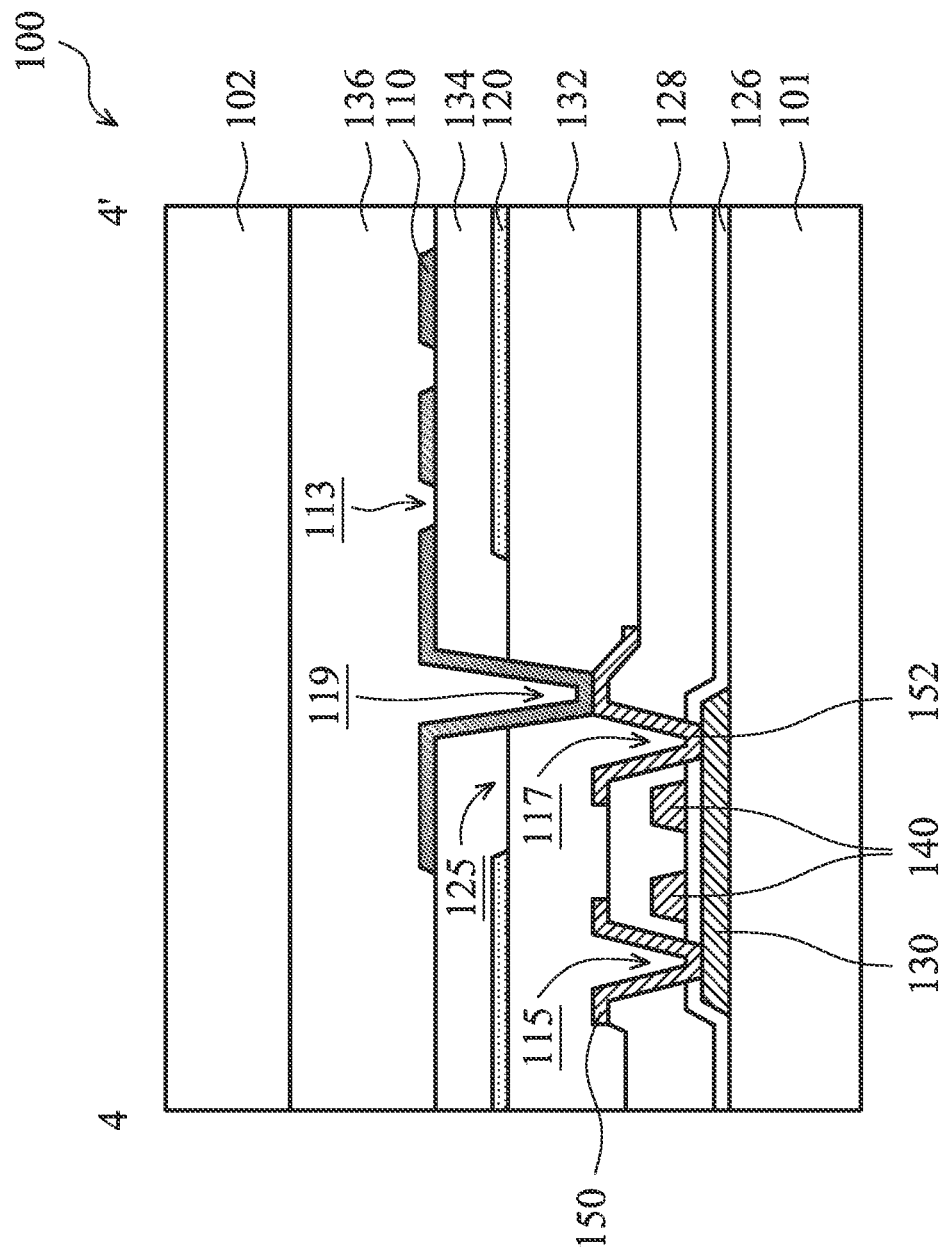
FIG. 4 shows a partial cross section of a display panel, along the line 4-4' shown in FIG. 3, according to some embodiments of the disclosure.

FIG. 4 shows a partial cross section of a display panel 100 along the line 4-4' shown in FIG. 3 according to some embodiments of the disclosure. As shown in FIG. 4, in some embodiments, the first transparent conductive layer 110 that is electrically connected to the second contact region 1302 of the active layer 130 is a patterned electrode including a plurality of slits 113. A second transparent conductive layer 120 is disposed under the first transparent conductive layer 110. The second transparent conductive layer 120 has an opening 125 near the second contact region 1302. The disposition of the opening 125 prevents the second transparent conductive layer 120 from covering the via hole 119, thereby avoiding the position of the via hole 119. In the embodiments, the display panel 100 is a FFS LCD panel due to the disposition of the slits 113 of the first transparent conductive layer 110 and the second transparent conductive layer 120.

Figure 5:
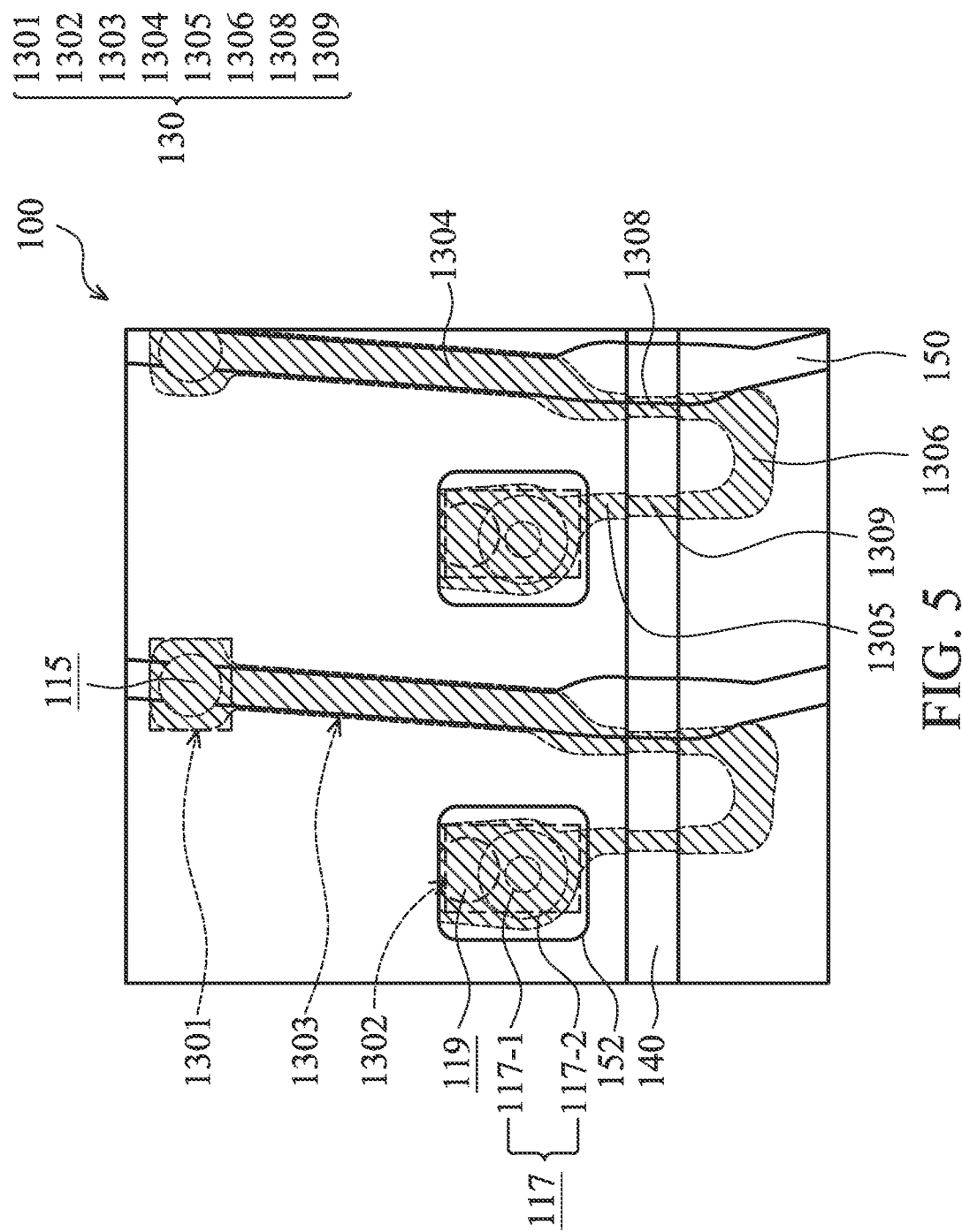
FIG. 5 shows a partial plane view of a display panel according to some other embodiments of the disclosure.

FIG. 5 shows a partial plane view of a display panel 100 according to some other embodiments of the disclosure. As shown in FIG. 5, in some embodiments, the first contact region 1301 of the active layer 130 is farther away from the scan line 140. As a result, the first non-channel region 1304 of the intermediate region 1303 that is disposed between the first contact region 1301 and the scan line 140 has a long length. In addition, in the embodiment of FIG. 5, the data line 150 can have a curved wiring type, and the data line 150 has an essentially extension direction. As a result, the intermediate region 1303 of the active layer 130 partially overlaps the data line 150. The intermediate region 1303 includes two areas disposed on two sides of the data line 150. In the embodiments, the area of the intermediate region 1303 disposed on the left side of the data line 150 has a larger width than the area of the intermediate region 1303 disposed on the right side of the data line 150. Moreover, as shown in FIG. 5, the via hole 117 in the second contact region 1302 of the active layer 130 has a bottom edge (also called a lower edge of the via hole) 117-1 and a top edge (also called an upper edge of the via hole) 117-2. The area surrounded by the bottom edge 117-1 is smaller than the area surrounded by the top edge 117-2. Accordingly, as shown in the plane view of FIG. 5, the via hole 117 has two cyclic boundaries. The via hole 115 and the via hole 119 also have a top edge and a bottom edge. FIGS. 1, 3, and 5 only show the top edges of the via holes.

As shown in the embodiments of FIG. 5, the widths of the first non-channel region 1304, the second non-channel region 1305, and the third non-channel region 1306 produced by the portions of the intermediate region 1303 of the active layer 130 that are not overlapped with the scan line 140 are greater than the widths of the first channel region 1308, and the second channel region 1309 produced by the portions of the intermediate region 1303 that are overlapped with the scan line 140. As a result, the pattern of the active layer 130 has a width change wherein the non-channel region is wider and the channel region is narrower. The effects of reducing the resistance and the parasitic capacitance of the active layer are achieved.

Furthermore, the first transparent conductive layer and the second transparent conductive layer of the display panel 100 are not shown in FIG. 5. In some embodiments, the display panel 100 of FIG. 5 can use the patterned electrode of the second transparent conductive layer 120 including the slits 122 shown in FIG. 1 to form a FFS LCD panel. In some other embodiments, the display panel 100 of FIG. 5 can use the patterned electrode of the first transparent conductive layer 110 including the slits 113 shown in FIG. 3 to form a FFS LCD panel.

Figure 6:
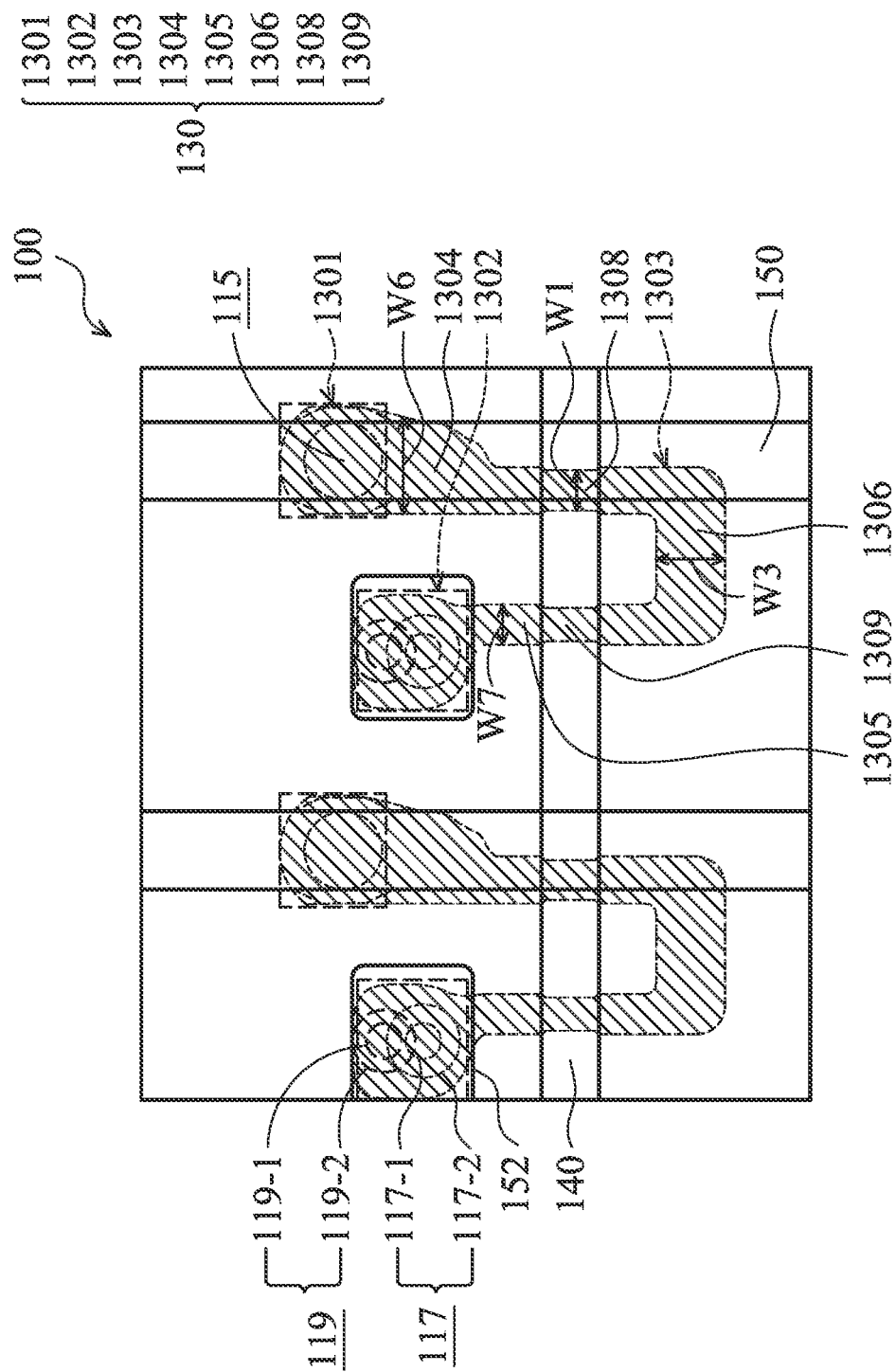
FIG. 6 shows a partial plane view of a display panel according to some other embodiments of the disclosure.

Referring to FIG. 6, a partial plane view of a display panel 100 according to some other embodiments of the disclosure is shown. As shown in FIG. 6, in some embodiments, the first contact region 1301 of the active layer 130 is near the scan line 140. As a result, the first non-channel region 1304 and the second non-channel region 1305 that are located between the first contact region 1301 and the second contact region 1302 have short lengths. However, the length of the first non-channel region 1304 is greater than the length of the second non-channel region 1305. As a result, the positions of the first contact region 1301 and the second contact region 1302 are staggered to reduce the influence on the resolution of the display panels. Because the contact region needs a big area, if two contact regions are aligned, it possibly requires a large sub-pixel width (that is parallel to the essentially extension direction of the scan line) to contain the first contact region 1301 and the second contact region 1302. It will limit the amount of sub-pixels, and the requirement that the display panels have high resolution is thereby impacted. In the embodiments, a portion of the intermediate region 1303 of the active layer 130 near the first contact region 1301 has a width W6, and a portion of the intermediate region 1303 near the second contact region 1302 has a width W7. The width W6 is greater than the width W7. In addition, the scan line 140 and the data line 150 can have a straight line pattern. In some other embodiments, the scan line 140 and the data line 150 can have a non-straight line pattern. The scan line 140 and the data line 150 respectively have an essentially extension direction.

Moreover, as shown in FIG. 6, the via hole 117 in the second contact region 1302 of the active layer 130 has a bottom edge (also called a lower edge of the via hole) 117-1 and a top edge (also called an upper edge of the via hole) 117-2. The area surrounded by the bottom edge 117-1 is smaller than the area surrounded by the top edge 117-2. The via hole 119 in the second contact region 1302 of the active layer 130 also has a bottom edge (also called a lower edge of the via hole) 119-1 and a top edge (also called an upper edge of the via hole) 119-2. The area surrounded by the bottom edge 119-1 is smaller than the area surrounded by the top edge 119-2. Accordingly, as shown in the plane view of FIG. 6, each of the via hole 117 and the via hole 119 has two cyclic boundaries. In other embodiments, the via holes can have a non-circular shape, such as an oval or an irregular shape.

As shown in the embodiments of FIG. 6, the widths of the first non-channel region 1304, the second non-channel region 1305, and the third non-channel region 1306 produced by the portions of the intermediate region 1303 of the active layer 130 that are not overlapped with the scan line 140 are greater than the widths of the first channel region 1308, and the second channel region 1309 produced by the portions of the intermediate region 1303 that are overlapped with the scan line 140. As a result, the pattern of the active layer 130 has a width change wherein the non-channel region is wider and the channel region is narrower. The effects of reducing the resistance and the parasitic capacitance of the active layer are thereby achieved.

Furthermore, the first transparent conductive layer and the second transparent conductive layer of the display panel 100 are not shown in FIG. 6. In some embodiments, the display panel 100 of FIG. 6 can use the patterned electrode of the second transparent conductive layer 120 including the slits 122 shown in FIG. 1. In some other embodiments, the slits 122 of the second transparent conductive layer 120 in the display panel 100 of FIG. 6 are continuing to exceed over the data line or the scan line, depending on design requirements. In some other embodiments, the display panel 100 of FIG. 6 can use the patterned electrode of the first transparent conductive layer 110 including the slits 113 shown in FIG. 3 to form a FFS LCD panel.

In summary, according to some embodiments of the disclosure, the pattern of the active layer of the TFTs in the display panel is improved, especially for the active layer made of LTPS. The widths of the non-channel regions are greater than the widths of the channel regions. The non-channel regions are produced by the intermediate region not overlapping the scan line. The intermediate region is located between the first contact region and the second contact region of the active layer. The channel regions are produced by the intermediate region overlapping the scan line. As a result, the pattern of the active layer has a width change wherein the non-channel region is wider and the channel region is narrower. The effects of reducing the resistance and the parasitic capacitance of the active layer are thereby achieved. The electrical performance of the TFTs is enhanced.

While the disclosure has been described by way of example and in terms of the embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic panel, comprising:
a first substrate;
a first conductive line and a second conductive line disposed on the first substrate, wherein the first conductive line extends along a first direction, and the second conductive line extends along a second direction and intersects the first conductive line;
an active layer disposed on the first substrate and between the second conductive line and the first substrate, wherein in a top view, the active layer comprises:
a first overlapping region overlapping a portion of the first conductive line;
a second overlapping region overlapping an another portion of the first conductive line;
a first non-overlapping region not overlapping the first conductive line and connected between the first overlapping region and the second overlapping region;
a second non-overlapping region extending along the second direction; and
a first contact region electrically connected to a connecting portion of the second conductive line through a first via hole;
wherein a portion of the first non-overlapping region extends along the first direction, the portion of the first non-overlapping region has a first minimum width in the second direction, the second non-overlapping region has a second minimum width in the first direction, and the first minimum width is greater than the second minimum width,
wherein the connecting portion of the second conductive line overlaps the first contact region of the active layer and the first via hole, and an outline of the connecting portion of the second conductive line has an arc shape.

2. The electronic panel of claim 1, wherein the first conductive line and the second conductive line intersect each other to form an intersecting region and a width of the first contact region in the first direction is greater than a width of the intersecting region in the first direction.

3. The electronic panel of claim 1, wherein the first conductive line and the second conductive line intersect each other to form an intersecting region and a width of the second conductive line corresponding to the first contact region in the first direction is different from a width of the second conductive line in the intersecting region.

4. The electronic panel of claim 1, wherein an outline of the active layer has an arc shape.

5. The electronic panel of claim 1, wherein the active layer further comprises a third non-overlapping region extending along the second direction, wherein the second non-overlapping region has a first length in the second direction, the third non-overlapping region has a second length in the second direction, and the first length is different from the second length.

6. The electronic panel of claim 5, wherein the second non-overlapping region overlaps the second conductive line.

7. The electronic panel of claim 1, wherein the active layer further comprises a second contact region, wherein an area of the second contact region is different from an area of the first contact region.

\* \* \* \* \*